(12) United States Patent
Chang et al.

(10) Patent No.: US 7,345,540 B2
(45) Date of Patent: Mar. 18, 2008

(54) AMPLIFIER CIRCUIT HAVING A COMPENSATING AMPLIFIER UNIT FOR IMPROVING LOOP GAIN AND LINEARITY

(75) Inventors: Ming-Hung Chang, Hsin-Chu Hsien (TW); Fu-Yuan Chen, Kao-Hsiung Hsien (TW)

(73) Assignee: Anpec Electronics Corporation, Hsin-Chu (TW)

( * ) Notice: Subject to any disclaimer, the term of this patent is extended or adjusted under 35 U.S.C. 154(b) by 245 days.

(21) Appl. No.: 11/163,158

(22) Filed: Oct. 7, 2005

(65) Prior Publication Data
US 2007/0035341 A1  Feb. 15, 2007

(30) Foreign Application Priority Data
Aug. 12, 2005  (TW) .............................. 94127522 A

(51) Int. Cl.
*H03F 1/04* (2006.01)
(52) U.S. Cl. .................... 330/207 A; 330/251; 330/51; 330/310
(58) Field of Classification Search ............ 330/207 A, 330/251, 51, 310
See application file for complete search history.

(56) References Cited

U.S. PATENT DOCUMENTS

| 4,453,132 | A | * | 6/1984 | Stamler | 330/107 |
| 5,635,871 | A | * | 6/1997 | Cavigelli | 330/107 |
| 5,974,089 | A | * | 10/1999 | Tripathi et al. | 375/247 |
| 6,118,336 | A | * | 9/2000 | Pullen et al. | 330/10 |
| 6,316,992 | B1 | * | 11/2001 | Miao et al. | 330/2 |
| 7,038,535 | B2 | * | 5/2006 | Lee | 330/10 |

* cited by examiner

*Primary Examiner*—Patricia Nguyen
(74) *Attorney, Agent, or Firm*—Winston Hsu

(57) ABSTRACT

An amplifier circuit includes a feedback loop; a former stage amplifier unit coupled to an input node of the amplifier circuit and the feedback loop for amplifying the difference between an input signal received from the input node and an output signal which comes back through the feedback loop, and outputting a first output signal; a compensating amplifier unit coupled to the former stage amplifier unit for amplifying the first output signal and outputting a second output signal; and an output stage amplifier unit coupled to the compensating amplifier unit and the feedback loop for outputting a third output signal according to the second output signal.

15 Claims, 5 Drawing Sheets

AMPLIFIER CIRCUIT HAVING A COMPENSATING AMPLIFIER UNIT FOR IMPROVING LOOP GAIN AND LINEARITY

BACKGROUND OF THE INVENTION

1. Field of the Invention

The invention relates to an amplifier circuit, and more particularly, to an amplifier circuit having a compensating amplifier unit for improving loop gain and reducing distortion.

2. Description of the Prior Art

The negative feedback mechanism that is capable of improving system linearity is broadly applied in the electronics industry. Please refer to FIG. 1. FIG. 1 is a schematic diagram illustrating a conventional feedback system 100. The feedback system 100 can be achieved utilizing an open-loop gain $A(s)$ and a feedback factor $\beta$. As one of ordinary skill in the pertinent art will understand, the relationship between an output voltage $V_o$ and an input voltage $V_i$ of the feedback system 100 is shown as follows:

$$\frac{Vo}{Vi} = \frac{A(s)}{1 + A(s)\beta} \qquad \text{Formula 1}$$

Oftentimes, when the value of the loop gain $A(s)\beta$ is much larger than 1, the relationship between the output voltage $V_o$ and the input voltage $V_i$ of the feedback system 100 can be simplified as follows in Formula 2:

$$\frac{Vo}{Vi} = \frac{1}{\beta} \text{ as } A(s)\beta \gg 1 \qquad \text{Formula 2}$$

The feedback factor, $\beta$, is a frequency irrelevant term. It means that Vo is proportional to Vi in all frequencies and the gain is a constant, $$\frac{1}{\beta}$$

if only if the loop gain $A(s)\beta$ is much larger than 1. However, if the feedback factor $\beta$ is increased, the close-loop gain $$\frac{1}{\beta}$$

is inevitably decreasing. Given this relationship, the feedback factor $\beta$ cannot be increased in an unlimited or unbounded fashion as a method for increasing the loop gain $A(s)\beta$ of the feedback system 100. Therefore, one of the practical means for increasing the loop gain $A(S)\beta$ of the feedback system 100 is by increasing the open-loop gain $A(s)$.

Please refer to FIG. 2. FIG. 2 is a circuit diagram of a typical amplifier circuit 200. The amplifier circuit 200 includes an integrator circuit 210, an output stage amplifier unit 220, and a feedback resistor $R_f$. The integrator circuit 210 includes an operational amplifier 212, a resistor $R_1$, and a capacitor $C_1$. In the amplifier circuit 200, the output stage amplifier unit 220 is commonly realized as an output stage with stable and fixed gain G, and the value of the gain G is designed according to various operational requirements and noise-rejection limitation. Generally, the value of the gain G is not large enough to serve as an open loop gain stage along. In order to increase the open-loop gain $A(s)$ in an effort to improve the system linearity, the method of related art will increase the open-loop gain by $A(s)$ coupling the integrator circuit 210 to the output stage amplifier unit 220. Adding the integrator circuit 210 not only increases the open-loop gain $A(s)$ but also serves the additional purpose of filtering unnecessary high-frequency noise. As one of ordinary skill in the pertinent art will understand, the relationship between an output voltage $V_o$ and an input voltage $V_i$ of the amplifier circuit 200 is shown as follows:

$$\frac{Vo}{Vi} = \frac{-\frac{G}{sC_1R_1}}{1 + \frac{G}{sC_1R_f}} = \frac{-\frac{G}{sC_1R_1}}{1 + \left(-\frac{G}{sC_1R_1}\right)\left(-\frac{R_1}{R_f}\right)} = \frac{A(s)}{1 + A(s)\beta} \qquad \text{Formula 3}$$

wherein $$A(s) = -\frac{G}{sC_1R_1}, \beta = -\frac{R_1}{R_f} \qquad \text{Formula 4}$$

Additionally, the loop gain $A(s)\beta$ of the amplifier circuit 200 can be detailed as shown below in Formula 5:

$$A(s)\beta = \frac{G}{sC_1R_f} \qquad \text{Formula 5}$$

As shown in Formula 5, in the context of the related art, the loop gain $A(s)\beta$ of the amplifier circuit 200 can be increased to improve the system linearity by increasing the gain G of the output stage amplifier unit 220 or by either decreasing the capacitor $C_1$ of the integrator circuit 210 or decreasing the resistance value of feedback resistor $R_f$. As mentioned previously, the gain G is usually small. And because of system stability issues and limitations of the operational frequency range, the capacitor $C_1$ of the integrator circuit 210 or the resistance of feedback resistor $R_f$ cannot be decreased unlimitedly or in an unbounded fashion. In consideration of these factors, the loop gain $A(s)\beta$ of the prior art is limited to a certain level and the linearity of the system can't not be further improved.

SUMMARY OF THE INVENTION

It is therefore one of the many objectives of the claimed invention to provide a compensating amplifier unit in an amplifier circuit for increasing the loop gain and improving the system linearity.

According to an aspect of the claimed invention, an amplifier circuit is disclosed. The amplifier circuit includes a feedback loop; a former stage amplifier unit coupled to an input node of the amplifier circuit and the feedback loop for amplifying the difference between an input signal received from the input node and an output signal which comes back through the feedback loop, and outputting a first output signal; a compensating amplifier unit coupled to the former stage amplifier unit for amplifying the first output signal and outputting a second output signal; and a output stage amplifier unit coupled to the compensating amplifier unit and the feedback loop for outputting a third output signal according to the second output signal.

The amplifier circuit in the claimed invention provides the advantages of reducing the system distortion by increasing the loop gain, and meanwhile improving the system's ability to reject power noise.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 3:
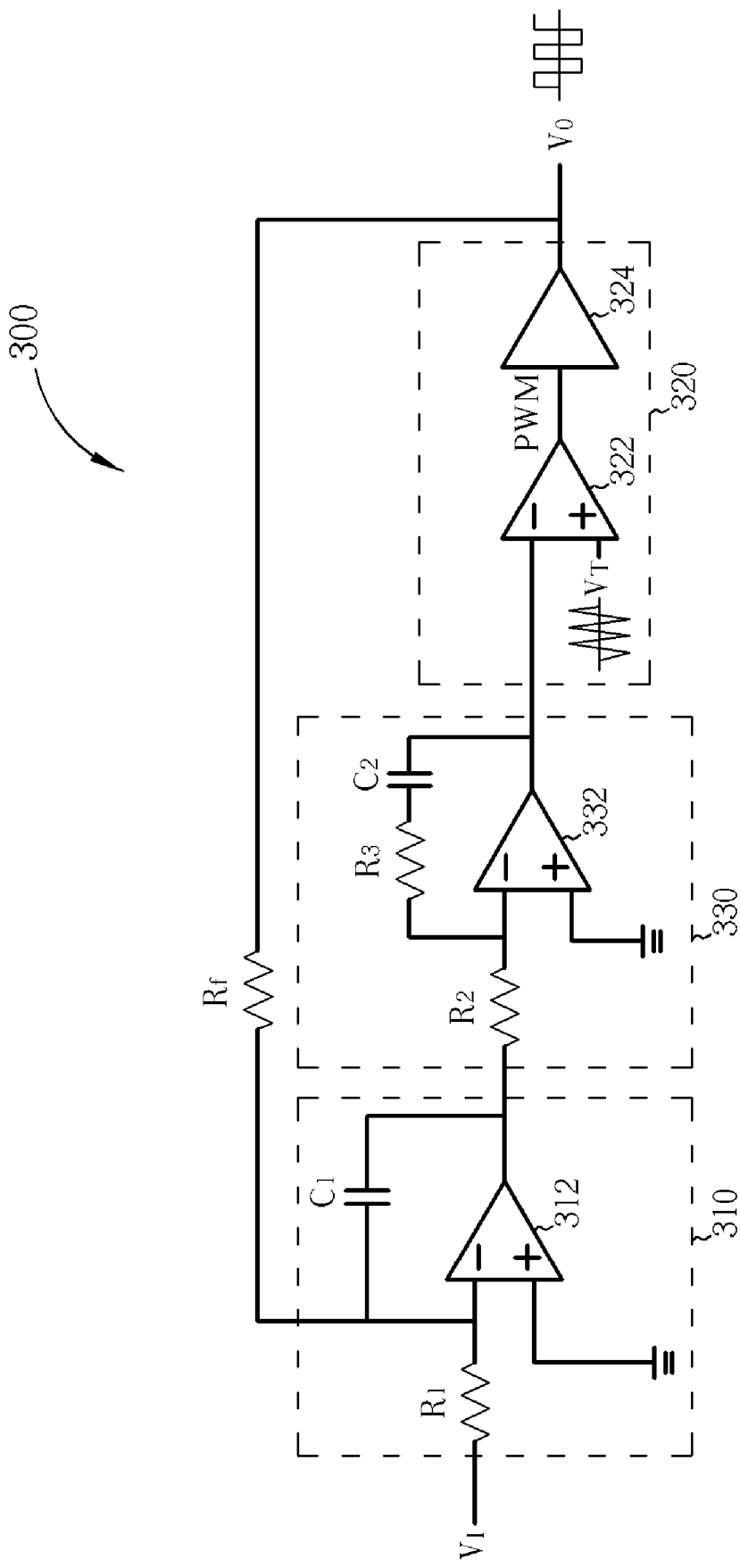
FIG. 3 is a block diagram of an amplifier circuit according to an embodiment of the present invention.

Please refer to FIG. 3. FIG. 3 is a block diagram of an amplifier circuit 300 according to an embodiment of the present invention. The amplifier circuit 300 includes a former stage amplifier unit 310, a compensating amplifier unit 330, an output stage amplifier unit 320, and a feedback resistor $R_f$ (i.e., the feedback resistor $R_f$ is perceived as a feedback loop). The former stage amplifier unit 310 includes an operational amplifier 312, a resistor $R_1$, and a capacitor $C_1$. The compensating amplifier unit 330 includes an operational amplifier 332, a plurality of resistors $R_2$, $R_3$, and a capacitor $C_2$. The output stage amplifier unit 320 includes a comparator 322 and a driver circuit 324. The comparator 332 is utilized to compare an output signal from the compensating amplifier unit 330 to a reference signal $V_T$ for generating a pulse width modulated (PWM) signal. Next, the driver circuit 324 is utilized to generate an output voltage $V_O$ according to the PWM signal. In this embodiment of the present invention, the former stage amplifier unit 310 amplifies a difference (i.e. error) between an input voltage $V_I$ and an output voltage $V_O$ which comes back through the feedback loop and outputs the amplified error voltage to the compensating amplifier unit 330. The compensating amplifier unit 330 further amplifies the error voltage and outputs the further amplified voltage to the output stage amplifier unit 320. Please note that, in this embodiment, both the former stage amplifier unit 310 and the compensating amplifier unit 330 are composed of the integrator circuit. However, many other embodiments of the present disclosure that utilize different amplifier application circuits are also possible. For example, to add a specific gain to the system, any circuit that is composed of an operational amplifier can be utilized in the former stage amplifier unit 310 or the compensating amplifier unit 330. By way of example, FIG. 3 illustrates the amplifier circuit of the present invention and is not intended to represent or meant to be taken as implying any limitations. Additionally, except for the basic integrator circuit, the compensating amplifier unit 330 further includes a resistor $R_3$. The related operation of the compensating amplifier unit 330 and included resistor $R_3$ is detailed later. Finally, in this embodiment, the output stage amplifier unit 320 is achieved by a switching amplifier circuit. However, in other embodiments of the present invention, the output stage amplifier unit 320 can be realized in a broad sense by utilizing any electric application circuit with a fixed gain G. That is, other embodiments of the present disclosure, which include different fixed gain G based on various operational requirements and noise-rejection limitation, are also possible.

In contrast to the related art, this embodiment in the present invention increases the loop gain $A(s)\beta$ of the amplifier circuit 300 to improve the system linearity by means of coupling the compensating amplifier unit 330 between the former stage amplifier unit 310 and the output stage amplifier unit 320. Please refer to the above-mentioned Formula 3 and Formula 4, the relationship between an output voltage $V_O$ and an input voltage $V_I$ of the amplifier circuit 300 is shown as follows:

$$\frac{Vo}{Vi} = -\frac{\frac{G(1+sC_2R_3)}{s^2C_2R_2C_1R_1}}{1+\frac{G(1+sC_2R_3)}{s^2C_2R_2C_1R_f}} = \frac{A(s)}{1+A(s)\beta} \qquad \text{Formula 6}$$

Additionally, the loop gain $A(s)\beta$ of the amplifier circuit 300 can be expressed as shown below:

$$A(s)\beta = \frac{G(1+sC_2R_3)}{s^2C_2R_2C_1R_f} \qquad \text{Formula 7}$$

Figure 4:
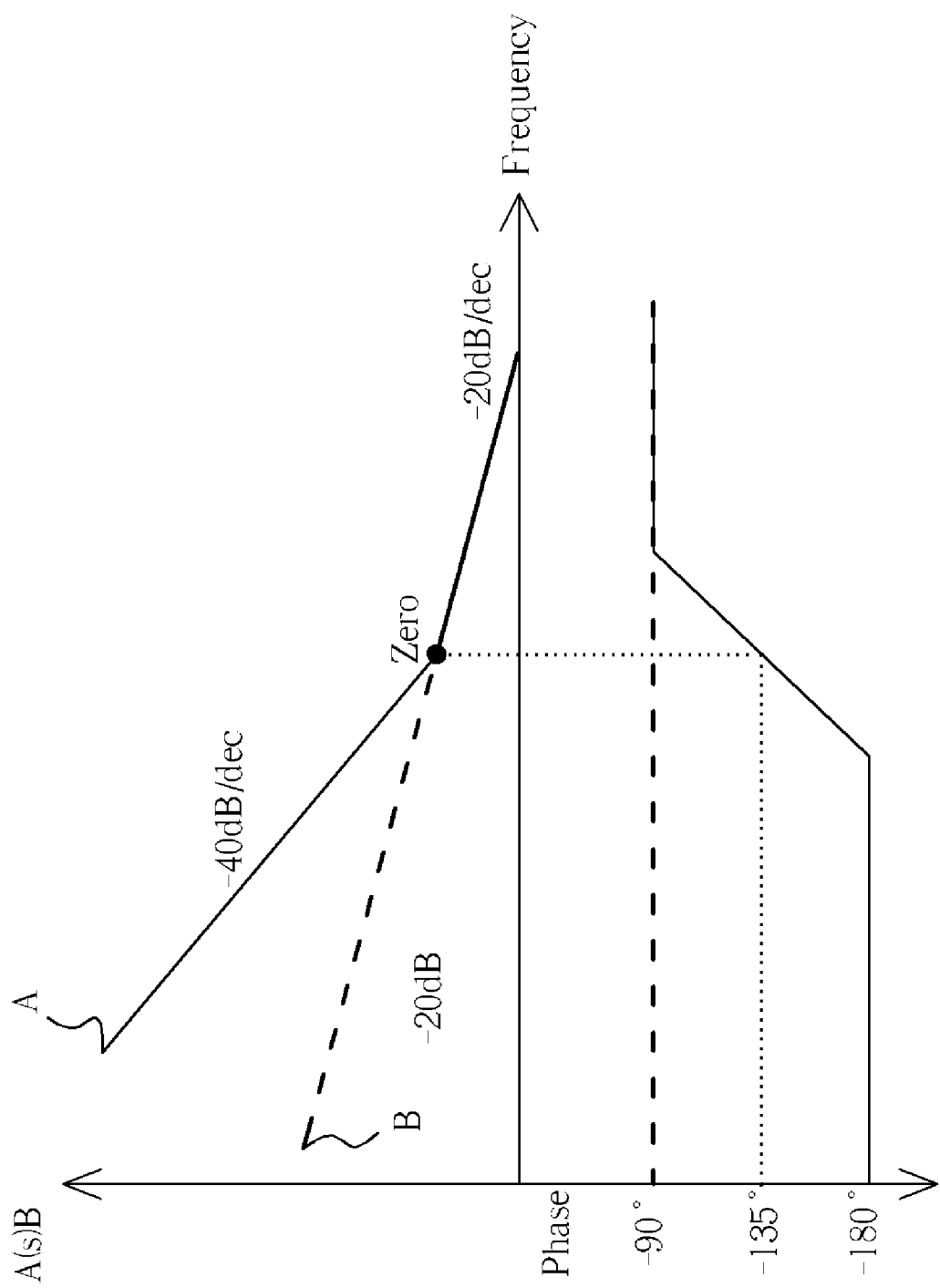
FIG. 4 is the loop-gain diagram comparing between the prior art and the present invention.

As shown in Formula 6 and Formula 7, in contrast to the related art, this embodiment in the present invention integrates the compensating amplifier unit 330 between and coupled to the former stage amplifier unit 310 and the output stage amplifier unit 320. The product of the resistors $R_2$ and the capacitor $C_2$ of the compensating amplifier unit 330 (i.e., the term $C_2R_2$ in Formula 7) is a value that is far less than 1. It can significantly increase the loop gain $A(s)\beta$ of the amplifier circuit 300 and therefore improve the system linearity. Additionally, except for the basic components of an integrator circuit (e.g., the operational amplifier 332, the resistors $R_2$, and the capacitor $C_2$), the compensating amplifier unit 330 further comprises a resistor $R_3$. As shown in Formula 7, the resistor $R_3$ provides the amplifier circuit 300 with a zero point in the frequency domain to increase the phase margin of the system. Please refer to FIG. 4. FIG. 4 is the Bode plot of the amplifier circuit 300 shown in FIG. 3. In FIG. 4, in addition to the dotted line B, which represents the loop gain-frequency related characteristic of the conventional amplifier circuit 200 shown in FIG. 2, FIG. 4 includes the solid line A that represents the loop gain-frequency related characteristic of the amplifier circuit 300 in the present invention as shown in FIG. 3. As shown in FIG. 4, in the required working frequency range, the loop gain A(s)β of the amplifier circuit 300 in the present invention is far greater than the loop gain of the conventional amplifier circuit 200. Besides, as mentioned above, the zero point in the frequency domain, which is provided from the resistor $R_3$, leads to the rate of convergence (ROC) after the zero point is about −20 dB/Dec, and this leads to the phase of the system being larger than 180 degrees. That is, the zero point ensures the phase margin is large enough (e.g., usually above 60 degrees), and then guarantees the stability of the amplifier circuit 300.

Moreover, the amplifier circuit 300 in the present invention also can improve the system's ability to reject the power noise, and thus increase the power supply rejection ratio (PSRR) of the system. In this embodiment, if the power noise of the system is $V_s$ and the relationship between the output voltage $V_O$ of the amplifier circuit 300 and the power noise $V_s$ can be expressed as follows:

$$\frac{Vo}{Vs} = \frac{s^2 C_2 R_2 C_1 R_f}{s^2 C_2 R_2 C_1 R_f + sGC_2 R_3 + G} \quad \text{Formula 8}$$

Figure 1:
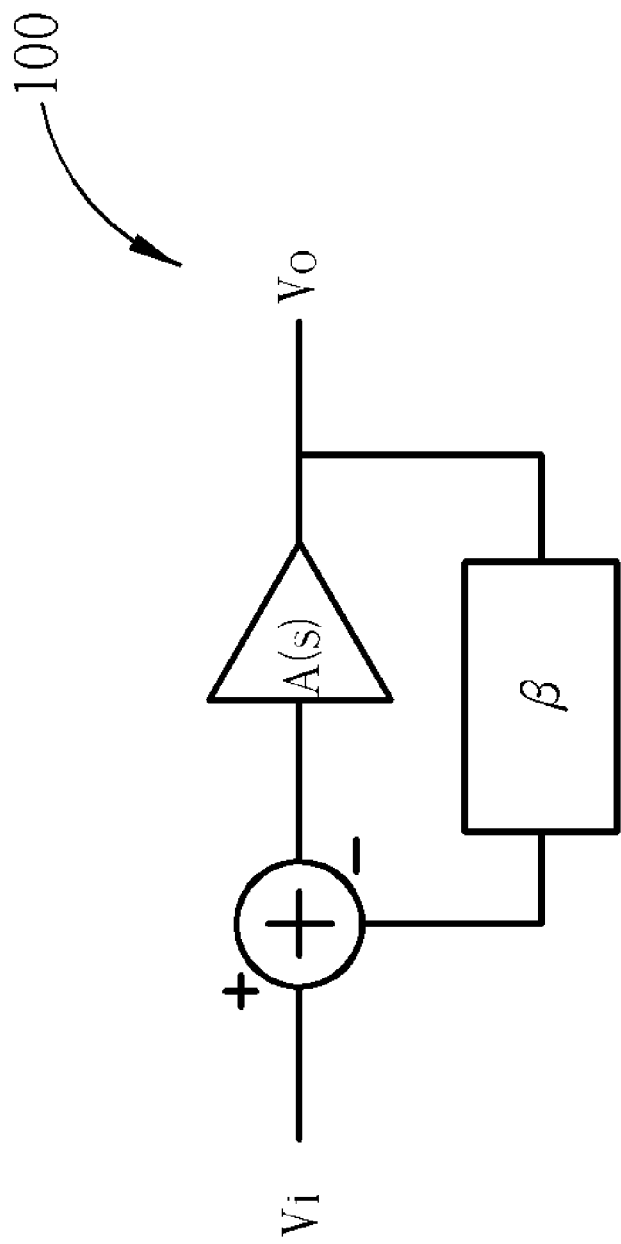
FIG. 1 is a schematic diagram illustrating a conventional feedback system.
Figure 2:
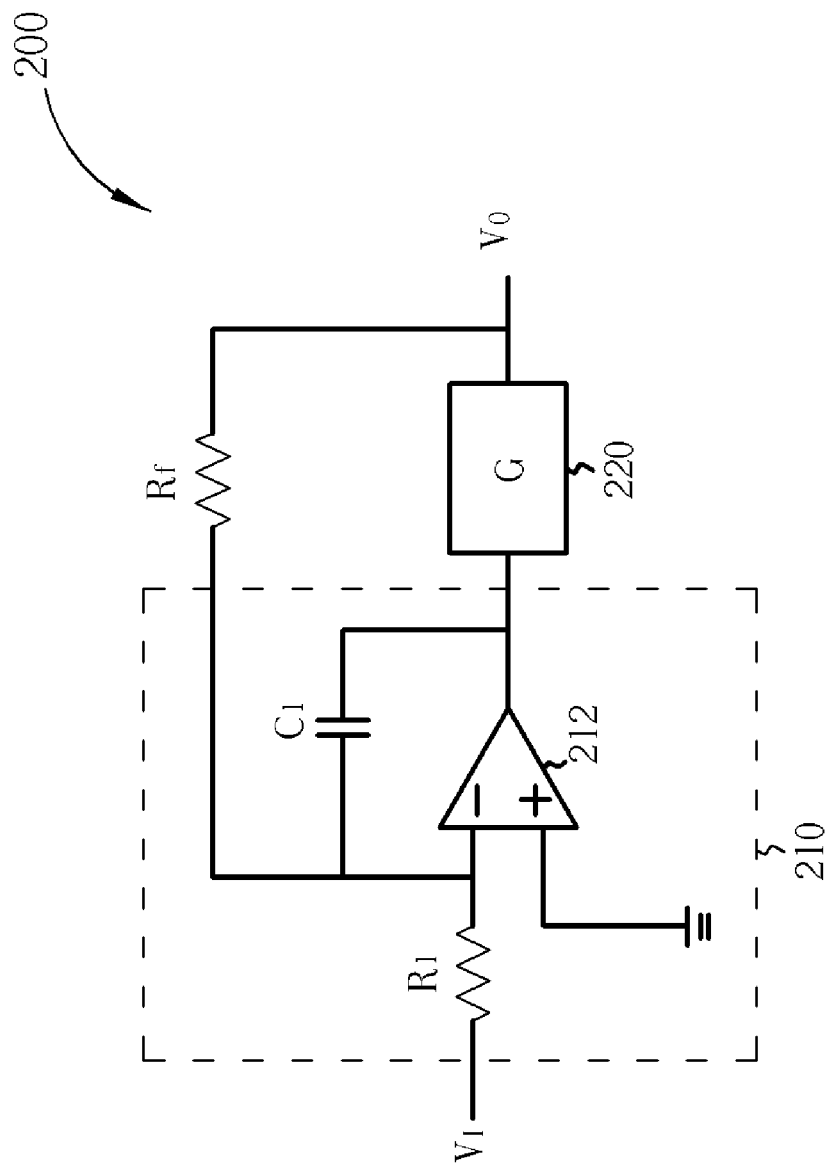
FIG. 2 is a circuit diagram of a typical amplifier circuit.

Additionally, for the conventional amplifier circuit 200 shown in FIG. 2, the relationship between the output voltage $V_O$ of the amplifier circuit 200 and the power noise $V_s$ can be expressed as follows:

$$\frac{Vo}{Vs} = \frac{s}{s + \frac{G}{C_1 R_f}} \quad \text{Formula 9}$$

Figure 5:
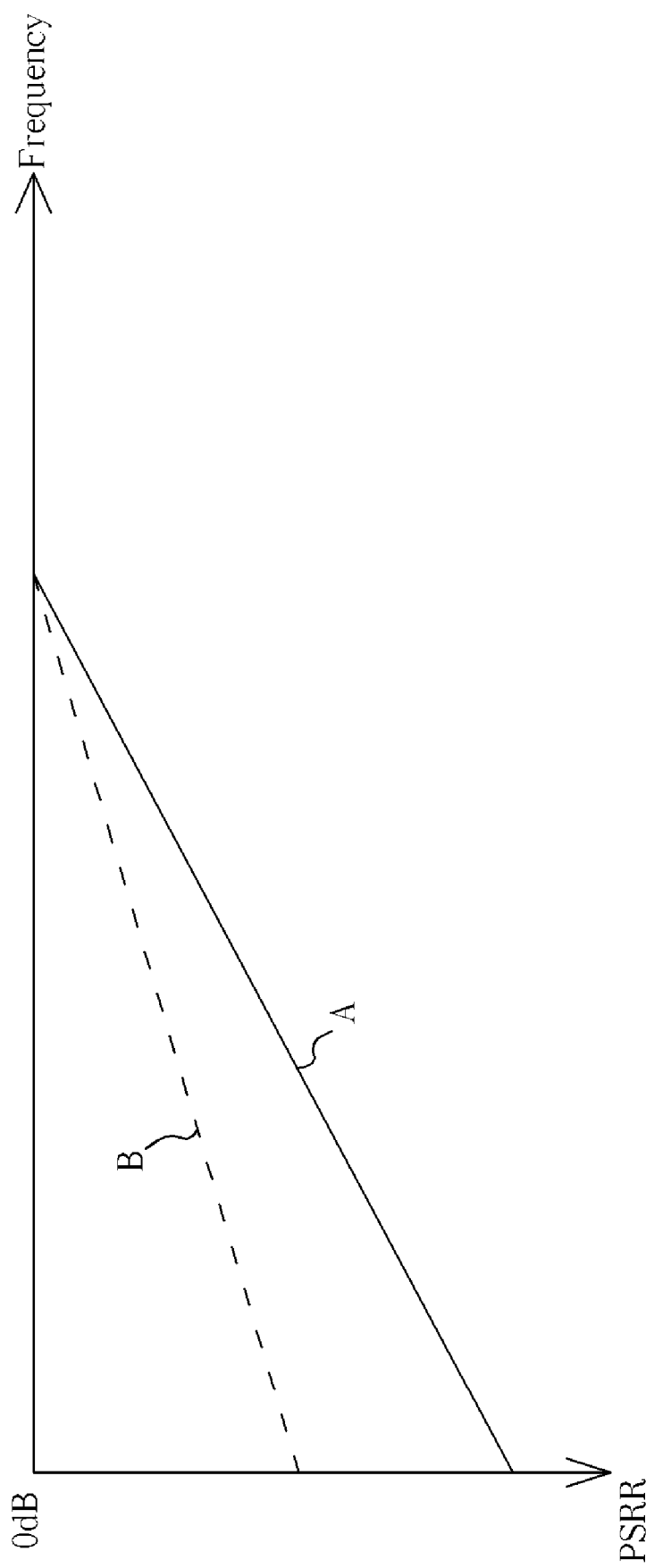
FIG. 5 is the PSRR-frequency related characteristic diagram comparing between the prior art and the present invention.

Please refer to FIG. 5. The solid line A shown in FIG. 5 represents the PSRR-frequency related characteristic of the amplifier circuit 300 in the present invention and the dotted line B shown in FIG. 5 represents the PSRR-frequency related characteristic of the conventional amplifier circuit 200. The feature curves shown in FIG. 5 can be elicited from the Formula 8 and Formula 9. Please note that, since the method of PSRR-frequency calculation is considered well known in the pertinent art, further details are therefore omitted for the sake of brevity. As shown in FIG. 5, in the needed (i.e., required) working frequency range, the PSRR of the amplifier circuit 300 is far greater than the PSRR of the conventional amplifier circuit 200. That is, comparing with the output voltage $V_O$ of the conventional amplifier circuit 200, the output voltage $V_O$ of the amplifier circuit 300 is less affected by the power noise $V_s$ and therefore significantly improves the noise-rejection ability.

As mentioned above, after the output stage amplifier unit 320 receives the further amplified error voltage outputted from the compensating amplifier unit 330, the comparator 332 is utilized to compare this voltage with a reference signal $V_T$ to generate a pulse width modulated (PWM) signal. In practice, the reference signal $V_T$ could be a triangular signal or sawtooth signal. Next, the driver circuit 324 is utilized to generate an output voltage $V_O$ according to the PWM signal. According to the amplifier circuit 300 in the present invention, the switch amplifier circuit applied in the amplifier circuit 300 reduces the system distortion by increasing the loop gain, and meanwhile improving the system's ability to reject power noise.

As mentioned above, after the output stage amplifier unit 320 receives the adjusted input voltage VI outputted from the former stage amplifier unit 310 and the compensating amplifier unit 330, the comparator 332 is utilized to compare this adjusted voltage with a reference signal Vr to generate a pulse width modulation (PMW) signal. In practice, the reference signal Vr is achieved as a triangular signal. Next, the driver circuit 324 is utilized to drive the PWM signal to generate an output voltage VO. According to the amplifier circuit 300 in the present invention, the switching amplifier circuit applied in the amplifier circuit 300 reduces the system distortion by improving the signal linearity, improves the system's ability to reduce power noise of the system, and therefore greatly advances the efficiency of the system.

What is claimed is:

1. An amplifier circuit, comprising:
   a feedback loop;
   a former stage amplifier unit coupled to an input node of the amplifier circuit and the feedback loop for amplifying the difference between an input signal received from the input node and a feedback signal outputted from an output node of the feedback loop, and outputting a first output signal according to the amplified difference;
   a compensating amplifier unit coupled to the former stage amplifier unit for amplifying the first output signal and outputting a second output signal; and
   an output stage amplifier unit coupled to the compensating amplifier unit and the feedback loop for inputting the second output signal and outputting a third output signal according to the second output signal;
   wherein there is no feedback loop from an output of the compensating amplifier unit to an input of the former stage amplifier unit.

2. The amplifier circuit of claim 1, wherein the former stage amplifier unit is an integrator, and the former stage amplifier unit comprises:
   a first input node coupled to the feedback loop;
   a first output node for outputting the first output signal;
   a first impedance unit coupled to the input signal and the first input node for providing a first impedance value; and
   a first capacitor unit coupled to the first input node and the first output node for providing a first capacitor value.

3. The amplifier circuit of claim 2, wherein the compensating amplifier unit is an integrator, and the compensating amplifier unit comprises:
   a second input node;
   a second output node for outputting the second output signal;
   a second impedance unit coupled to the first output node and the second input node for providing a second impedance value; and
   a second capacitor unit coupled to the second input node and the second output node for providing a second capacitor value.

4. The amplifier circuit of claim 3, wherein the compensating amplifier unit farther comprises a third impedance unit coupled in series to the second capacitor unit for providing a third impedance value.

5. An amplifier circuit comprising:
a feedback loop;
a former stage amplifier unit being an integrator coupled to an input node of the amplifier circuit and the feedback loop for amplifying the difference between an input signal received from the input node and a feedback signal outputted from an output node of the feedback loop, and outputting a first output signal according to the amplified difference, the former stage amplifier unit comprising:
  a first input node coupled to the feedback loop;
  a first output node for outputting the first output signal;
  a first impedance unit coupled to the input signal and the first input node for providing a first impedance value; and
  a first capacitor unit coupled to the first input node and the first output node for providing a first capacitor value;
a compensating amplifier unit being an integrator coupled to the former stage amplifier unit for amplifying the first output signal and outputting a second output signal, the compensating amplifier unit comprising:
  a second input node;
  a second output node for outputting the second output signal;
  a second impedance unit coupled to the first output node and the second input node for providing a second impedance value;
  a second capacitor unit coupled to the second input node and the second output node for providing a second capacitor value; and
  a third impedance unit coupled to the second capacitor unit for providing a third impedance value; and
an output stage amplifier unit coupled to the compensating amplifier unit and the feedback loop for outputting a third output signal according to the second output signal,
wherein the product of the third impedance value and the second capacitor value is less than 1.

6. The amplifier circuit of claim 1, wherein the compensating amplifier unit is an integrator, and the compensating amplifier unit comprises:
an input node;
an output node for outputting the second output signal;
a first impedance unit coupled to the input node of the integrator for providing a first impedance value; and
a capacitor unit coupled to the input node of the integrator and the output node of the integrator for providing a capacitor value.

7. The amplifier circuit of claim 6, wherein the compensating amplifier unit farther comprises a second impedance unit coupled in series to the capacitor unit for providing a second impedance value.

8. An amplifier circuit comprising:
a feedback loop;
a former stage amplifier unit coupled to an input node of the amplifier circuit and the feedback loop for amplifying the difference between an input signal received from the input node and a feedback signal outputted from an output node of the feedback loop, and outputting a first output signal according to the amplified difference;
a compensating amplifier unit being an integrator coupled to the former stage amplifier unit for amplifying the first output signal and outputting a second output signal, the compensating amplifier unit comprising:
  an input node;
  an output node for outputting the second output signal;
  a first impedance unit coupled to the input node of the integrator for providing a first impedance value;
  a capacitor unit coupled to the input node of the integrator and the output node of the integrator for providing a capacitor value; and
  a second impedance unit coupled to the capacitor unit for providing a second impedance value; and
an output stage amplifier unit coupled to the compensating amplifier unit and the feedback loop for outputting a third output signal according to the second output signal,
wherein the product of the second impedance value and the capacitor value is less than 1.

9. The amplifier circuit of claim 7, wherein the output stage amplifier unit is a switching amplifier.

10. The amplifier circuit of claim 1, wherein the feedback loop comprises an impedance unit for providing a feedback impedance value.

11. An amplifier circuit, comprising:
a feedback loop;
a first integrator coupled to an input node of the amplifier circuit and the feedback loop for amplifying the difference between an input signal received from the input node and a feedback signal outputted from an output node of the feedback loop, and outputting a first output signal according to the amplified difference;
a second integrator coupled to the first integrator for amplifying the first output signal and outputting a second output signal; and
a switching amplifier coupled to the second integrator and the feedback loop for inputting the second output signal and outputting a third output signal according to the second output signal;
wherein there is no feedback loop from an output of the second integrator to an input of the first integrator.

12. The amplifier circuit of claim 1, wherein the output stage amplifier unit comprises:
a comparator having a first input coupled to the compensating amplifier unit and a second input coupled to a reference signal, for comparing the second output signal to the reference signal and generating a comparison result signal; and
a driver circuit having an input end coupled to the comparator and an output end coupled to the feedback loop, for receiving the comparison result signal and generating the third output signal.

13. The amplifier circuit of claim 12, wherein the reference signal is a sawtooth signal and the comparison result signal is a pulse width modulated (PWM) signal.

14. The amplifier circuit of claim 11, wherein the switching amplifier comprises:
a comparator having a first input coupled to the second integrator and a second input coupled to a reference signal, for comparing the second output signal to the reference signal and generating a comparison result signal; and
a driver circuit having an input coupled to the comparator and having an output end coupled to the feedback loop, for receiving the comparison result signal and generating the third output signal.

15. The amplifier circuit of claim 14, wherein the reference signal is a sawtooth signal and the comparison result signal is a pulse width modulated (PWM) signal.

* * * * *